United States Patent
Pan et al.

[11] Patent Number: 6,156,633
[45] Date of Patent: Dec. 5, 2000

[54] PROCESS FOR FORMING HIGH TEMPERATURE STABLE SELF-ALIGNED METAL SILICIDE LAYER

[75] Inventors: Hong-Tsz Pan, Hsinchu Hsien; Tung-Po Chen, Taichung, both of Taiwan

[73] Assignee: United Microelectronics Corp., Hsin-Chu, Taiwan

[21] Appl. No.: 09/034,261

[22] Filed: Mar. 4, 1998

[30] Foreign Application Priority Data

May 17, 1997 [TW] Taiwan ................................. 86106594

[51] Int. Cl.[7] ...................................................... H01L 21/44
[52] U.S. Cl. ............................................. 438/592; 438/683
[58] Field of Search ..................... 438/621, 582, 438/583, 592, 683

[56] References Cited

U.S. PATENT DOCUMENTS

| | | |
|---|---|---|
| 4,920,073 | 4/1990 | Wei et al. . |
| 5,242,860 | 9/1993 | Nulman et al. . |
| 5,326,724 | 7/1994 | Wei . |
| 5,413,957 | 5/1995 | Byun . |
| 5,593,924 | 1/1997 | Apte et al. . |
| 5,607,884 | 3/1997 | Byun . |
| 5,731,226 | 3/1998 | Lin et al. . |
| 5,750,437 | 5/1998 | Oda . |
| 5,831,335 | 11/1998 | Miyamoto . |
| 5,834,368 | 11/1998 | Kawaguchi et al. . |
| 5,911,114 | 6/1999 | Naem . |

OTHER PUBLICATIONS de Lanerolle et al "Titanium silicide growth by rapid–thermal processing of Ti films deposited on lighly doped and heavlily doped silicon substrates," J. Vac Sci. Technol. B 5 (6) p. 1689, Nov. 1987.

Wolf, Silicon Processing for the VLSI Era–vol. 2, pp. 132–133, 164–167, 1990.

*Primary Examiner*—Richard Booth
*Attorney, Agent, or Firm*—Finnegan, Henderson, Farabow, Garrett & Dunner

[57] ABSTRACT

A process for forming high temperature stable self-aligned silicide layer that not only establishes itself smoothly and uniformly despite the use of a high temperature in the siliciding reaction, but also can withstand other subsequent high temperature thermal processing operations and maintaining a stable metal silicide layer profile thereafter. Moreover, desired thickness and uniformity of the metal silicide layer can be obtained by suitably adjusting the amorphous implant parameters, while the use of a titanium nitride cap layer help to stabilize the metal silicide layer during high temperature formation and that a stable and uniform metal silicide layer profile can be ensured even if subsequent high temperature processing operations are performed.

24 Claims, 6 Drawing Sheets

PROCESS FOR FORMING HIGH TEMPERATURE STABLE SELF-ALIGNED METAL SILICIDE LAYER

CROSS-REFERENCE TO RELATED APPLICATION

This application claims the priority benefit of Taiwan application serial no. 86106594, filed May 17, 1997, the fill disclosure of which is incorporated herein by reference.

BACKGROUND OF THE INVENTION

1. Field of Invention

This invention relates to a self-aligned silicide process, and more particularly to a process for forming a self-aligned metal silicide layer such that the metal silicide layer is formed smoothly despite the use of a high processing temperature. Also, the profile of the metal silicide layer can be kept in a stable condition even when the silicide layer is subjected to subsequent high temperature processing operations.

2. Description of Related Art

In the design of integrated circuits, as the level of integration for semiconductor components is increased, resistance in the source/drain terminals of a MOS component will correspondingly increase. When the resistance is increased to a level comparable to the resistance of a MOS channel, in order to reduce the sheet resistance in the source/drain terminals as well as to maintain integrity for the shallow junction between the metal layer and the MOS component, a process known as the self-aligned metal silicide process is often applied in the fabrication of very large scale integration (VLSI) circuits for line widths smaller than about 0.5 $\mu$m.

FIGS. 1A through 1D are cross-sectional views showing the progression of manufacturing steps for a conventional self-aligned silicide process. First, referring to FIG. 1A, a silicon substrate 100 with the main parts of an integrated circuit already formed above, for example, a field oxide layer 110, a gate 120 and source/drain regions 130, is provided.

Referring next to FIG. 1B and FIG. 1C, in the subsequent steps a titanium (Ti) layer 140 is formed on the field oxide layer 110, the gate 120 and the source/drain regions 130. Thereafter, a thermal processing operation, for example, a rapid thermal processing, is performed so that part of the titanium layer 140 reacts with the polysilicon on the upper surface 121 of the gate 120 and the silicon layer on the upper surface 131 of the source/drain terminals 130 to form titanium silicide ($TiSi_2$) layers 150.

Referring next to FIG. 1D, a wet etching method is used to remove the reacted or residual titanium layer 140 (the residual titanium layer may not necessarily be in the same original form), and leaving behind a layer of titanium silicide 150 on the gate 120 and source/drain regions 130.

A self-aligned silicide process not only can establish a low resistance metal silicide layer, for example, a titanium silicide layer, on silicon and polysilicon surfaces, but also can do so without photo lithographic processing operations. Therefore, it is a very attractive contact metallization procedure. However, owing to the high temperature needed in the process, the siliciding steps are hard to control. Although rapid thermal processing is frequently used in such self-aligned silicide processes, process yield is somewhat low due to the restrictions imposed by the level of maturity in technical applications and other unresolved manufacturing problems.

FIG. 2 shows a cross-sectional view of the titanium silicide layer during subsequent high temperature processing operations after its formation by a conventional self-aligned silicide process. Referring to FIG. 2, after the formation of a self-aligned silicide layer by a conventional process as shown in FIG. 1D, a dielectric layer 260 and a passivation silicon nitride ($Si_3N_4$) layer 270 are sequentially formed on the field oxide layer 110, the gate 120 and the source/drain regions 130 above the silicon substrate 100. After that, high temperature processing operations are performed to convert the original titanium silicide layers 150 into titanium silicide layers 250a, 250b and 250c, respectively. For example, if the component is a logic device, then high temperature processing operations are necessary for the formation of its peripheral memory components. These subsequent high temperature processing operations damage the good titanium silicide layer 150 and transform it into somewhat irregular forms 250a, 250b and 250c. As a result, the production yield is greatly reduced by using the conventional self-aligned silicide process.

In light of the foregoing, there is a need in the art for an improved process.

SUMMARY OF THE INVENTION

It is therefore an object of this invention to provide a process for forming high temperature stable self-aligned metal silicide layer that not only can generate a smooth and uniform metal silicide layer despite the use of high temperature siliciding reaction, but also can withstand other subsequent high temperature processing operations so that a rather stable metal silicide layer profile is still maintained.

To attain the objects and advantages, and in accordance with the purpose of the invention, as embodied and broadly described herein, the invention is a process for forming a high temperature stable self-aligned metal silicide layer comprising the steps of providing a silicon substrate having a gate and source/drain terminals formed thereon; implanting ions into the silicon substrate; sequentially forming a titanium layer and a titanium nitride layer over the silicon substrate; performing a two-stage thermal processing operation to form a titanium silicide layer from portions of the titanium layer on the gate and the source/drain terminals; and removing the titanium nitride layer and remaining portions of the titanium layer.

It is preferred that the thermal processing operation further include rapid thermal processing, and the implanting step may further include a selective implantation using a mask. In a preferred embodiment, the implanting step includes implanting the silicon substrate with arsenic (As) or argon (Ar) or nitrogen ($N^+$) ions having an energy level of between 20~80 KeV and a dosage level of between 5E13~5E14.

Preferably, the thermal processing operation includes sub-high temperature thermal processing and high temperature thermal processing. The sub-high temperature thermal processing may include heating to a temperature of between 550~700° C., and more preferably, between 650~850° C. for about 20~60 seconds. It is preferred that the thermal processing operation include heating in an atmosphere of nitrogen.

The removing step preferably includes selective etching of the titanium nitride layer and the remaining portions of the titanium layer, and the selective etching steps may include a wet etching for exposing the titanium nitride layer and the titanium layer to an RCA-1 prescription of $H_2O:H_2O_2:OH_4OH$.

The wet etching step may also include exposing the titanium nitride layer and the titanium layer to an SO prescription of $H_2O:H_2O_2:H_2SO_4$.

A similar process may be performed on a silicon substrate having an exposed silicon layer and an exposed polysilicon layer on its upper surface to form a high temperature stable self-aligned metal silicide layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain principles of the invention. In the drawings.

DESCRIPTION OF THE PREFERRED EMBODIMENTS

Figure 1A:
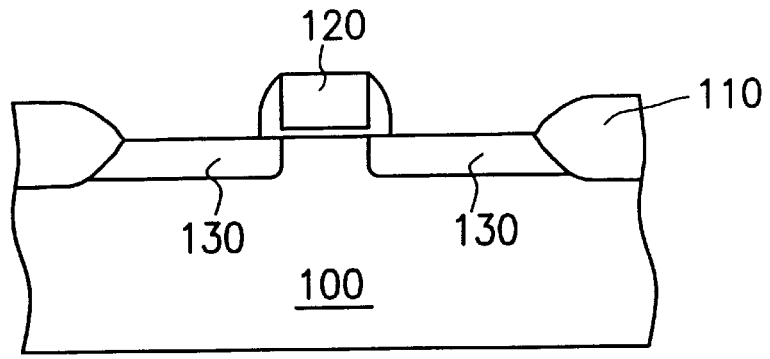
FIGS. 1A through 1D are cross-sectional views showing the progression of manufacturing steps in a conventional self-aligned silicide process.
Figure 1B:
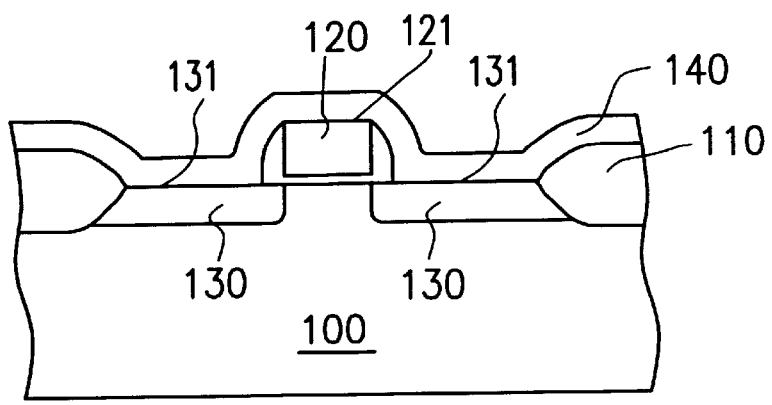
Figure 1C:
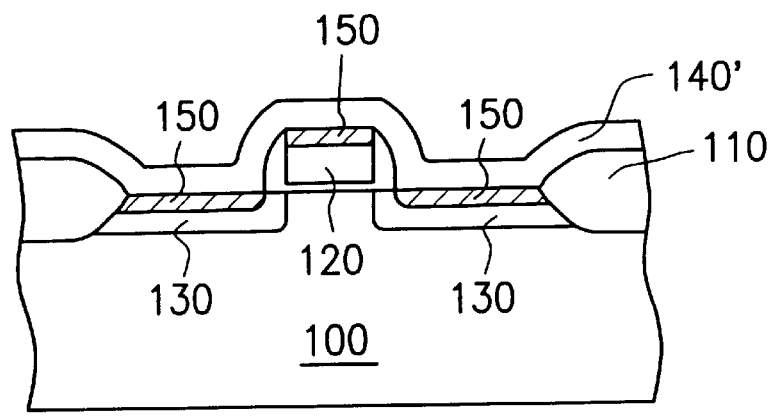
Figure 1D:
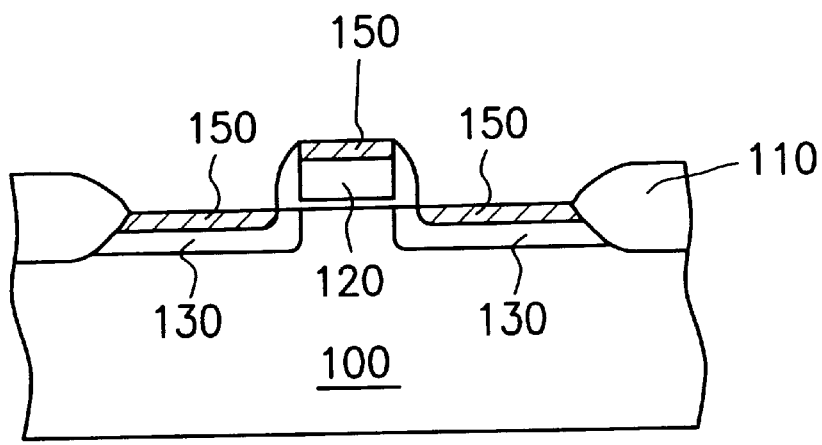
Figure 2:
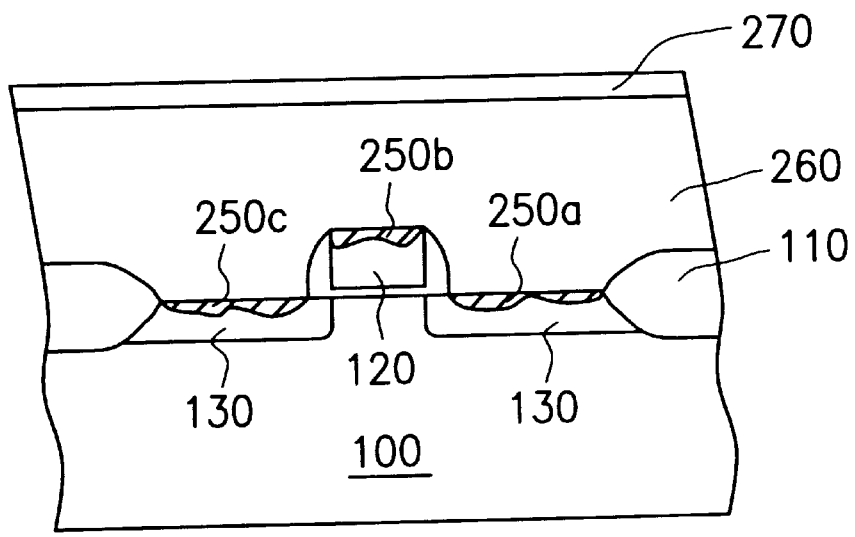
FIG. 2 shows a cross-sectional view of the titanium silicide layer in subsequent high temperature processing operations after the formation of a self-aligned silicide layer by the conventional process.

Reference will now be made in detail to the present preferred embodiments of the invention, examples of which are illustrated in the accompanying drawings. Wherever possible, the same reference numbers are used in the drawings and the description to refer to the same or like parts.

Figure 3:
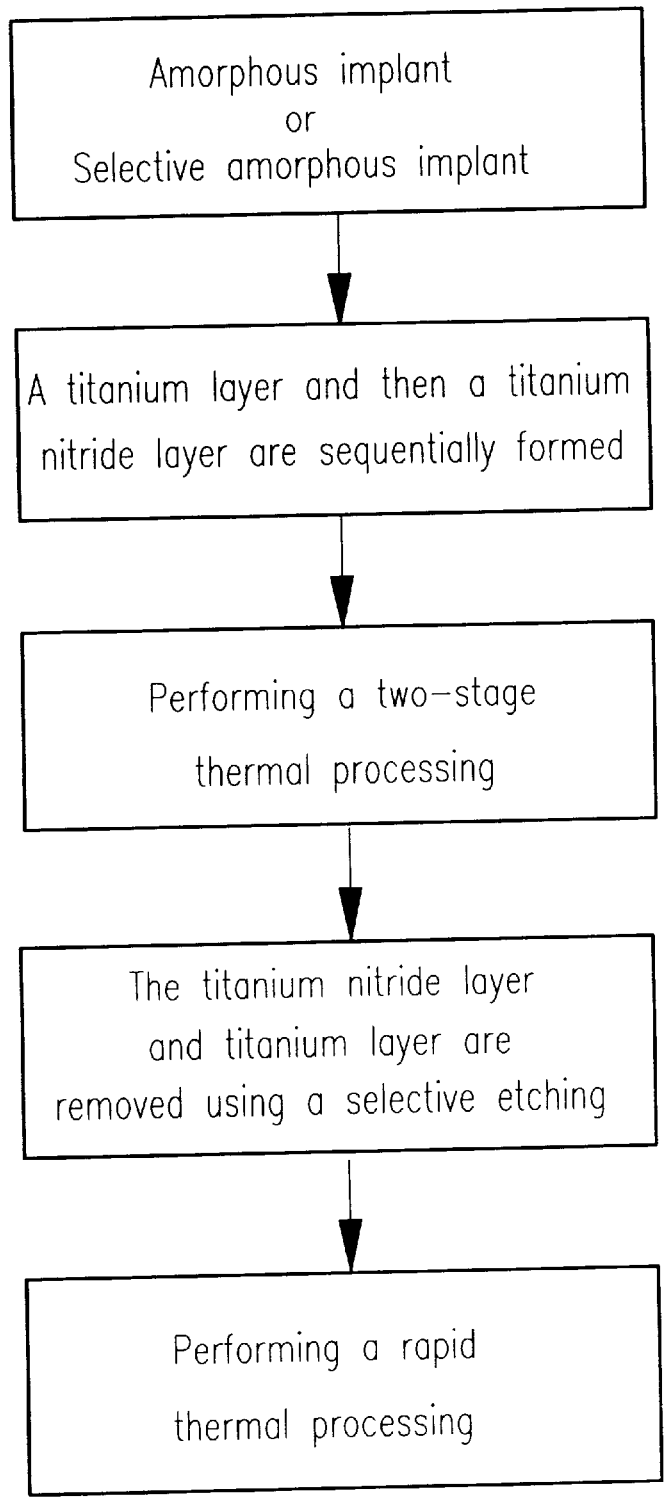
FIG. 3 is a flow diagram showing the stages involved in the formation of the high temperature stable self-aligned metal silicide layer according to the invention.

FIG. 3 is a flow diagram showing the stages involved in the formation of the high temperature stable self-aligned metal silicide layer according to the invention. First, referring to FIG. 3, a silicon substrate having a silicon or a polysilicon layer exposed on its upper surface is provided. Then, selective amorphous implant using a mask is performed with regard to the silicon substrate. After that, a titanium and then a titanium nitride (TiN) layer are sequentially formed above the silicon substrate. Next, a two-stage thermal processing operation is performed, using first high temperature and then a second high temperature for high temperature siliciding of the silicon substrate and forming a titanium silicide layer on the upper surface of the silicon or polysilicon layer. Subsequently, the titanium nitride and titanium layer are removed using a selective etching method.

Finally, a rapid thermal processing operation can be applied to transform the titanium silicide crystal structure from a C-49 phase into a C-54 phase.

FIGS. 4A through 4E are a series of diagrams showing the manufacturing flow for producing a high temperature stable self-aligned metal silicide layer using a complementary MOS as an example according to one preferred embodiment of this invention. First, referring to FIG. 4A and FIG. 4B, a silicon substrate 400 with the main parts of an integrated circuit already formed above, for example, N-wells 410, field oxide layers 420, gate terminals 430 and source/drain terminals 440, is provided. Then, an amorphous implant using a mask is performed with respect to the silicon substrate 400. For example, a selective amorphous implant using arsenic (As) or argon (Ar) or nitrogen ions ($N^+$) 450 having energy of about 20~80 KeV and a dosage of about 5E13~5E14 is executed aiming at the silicon substrate 400. Implant depth obtained by the amorphous implant process can be set by varying the amount of energy and dosage of the implanting ions, and hence the desired thickness of the subsequently formed metal silicide layer can be easily controlled. Moreover, the level of uniformity in the metal silicide layer (for example, titanium silicide layer) can be chosen through a careful selection of the implanting parameters.

Figure 4A:
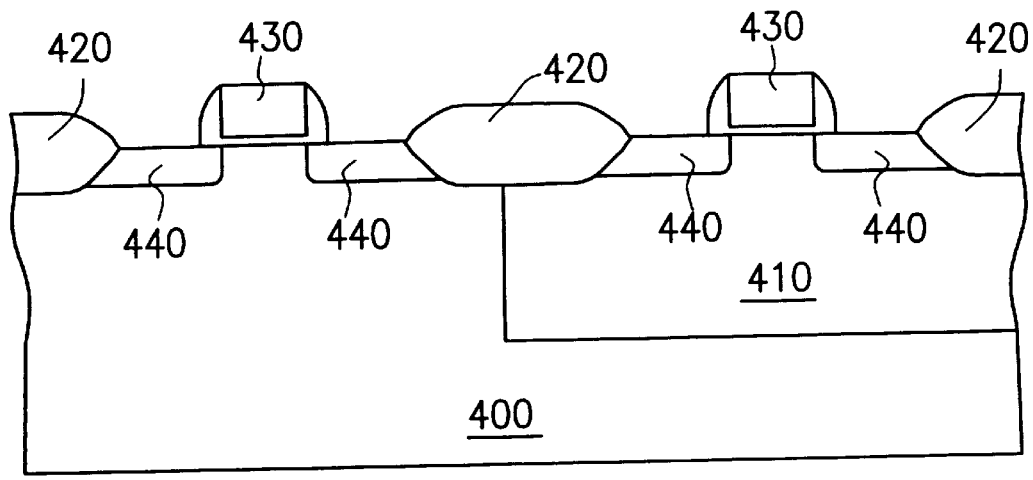
FIGS. 4A through 4E are a series of diagrams showing the manufacturing flow for producing a high temperature stable self-aligned metal silicide layer using a complementary MOS as an example according to one preferred embodiment of this invention.
Figure 4B:
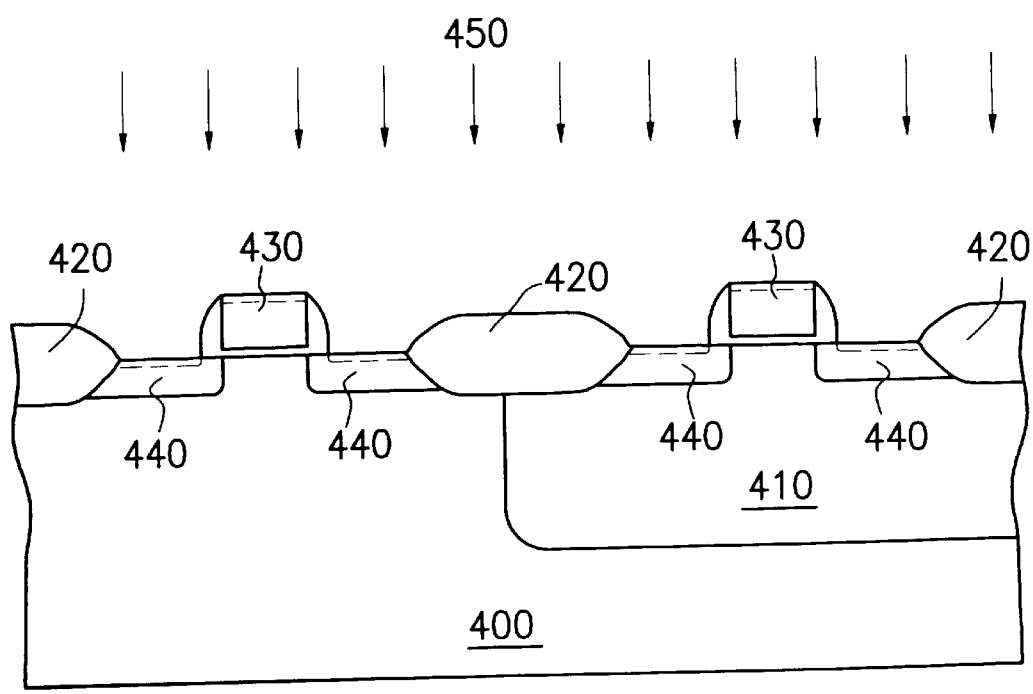
Figure 4C:
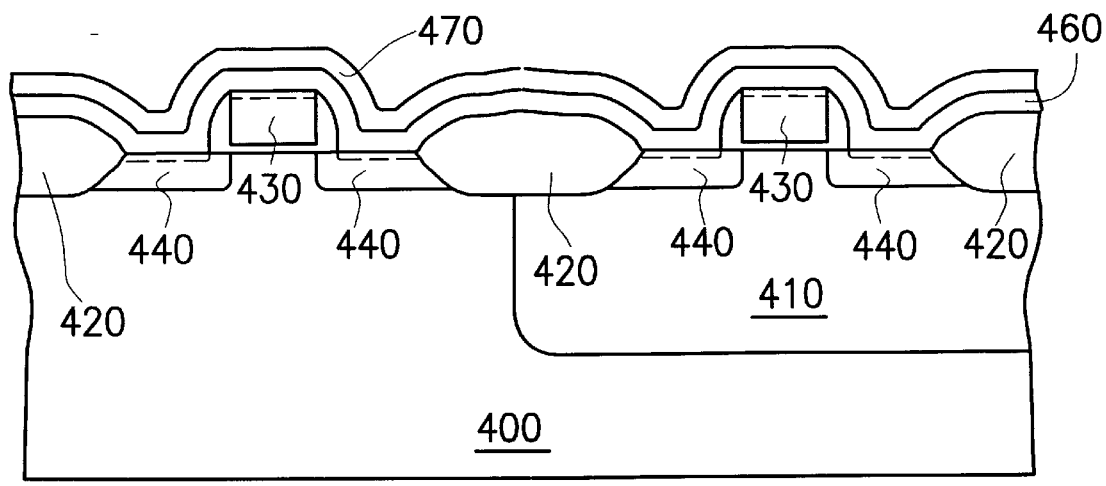
Figure 5A:
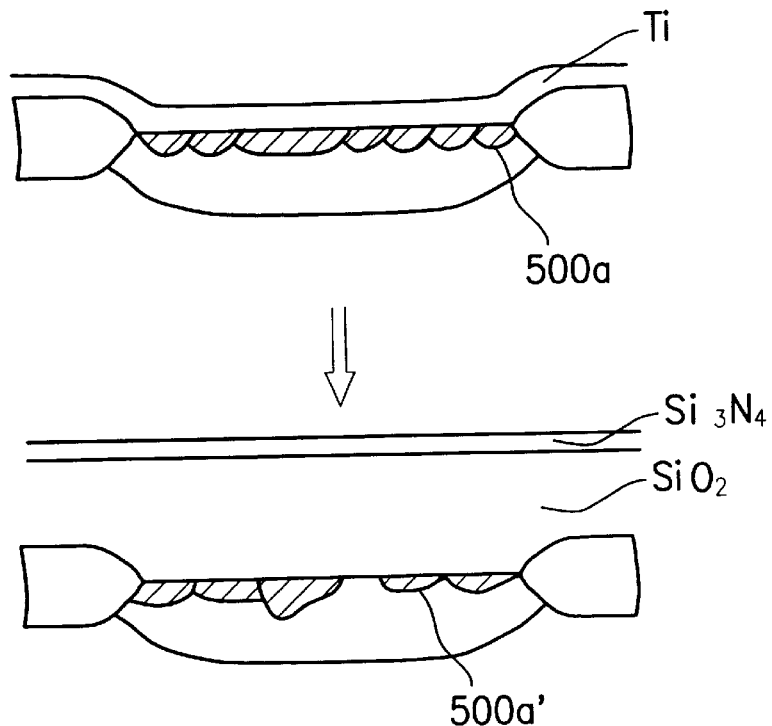
FIG. 5A is a cross-sectional view showing the titanium silicide crystal transformation after subsequent high temperature thermal processing operations for a self-aligned silicide layer formed by the conventional process.
Figure 5B:
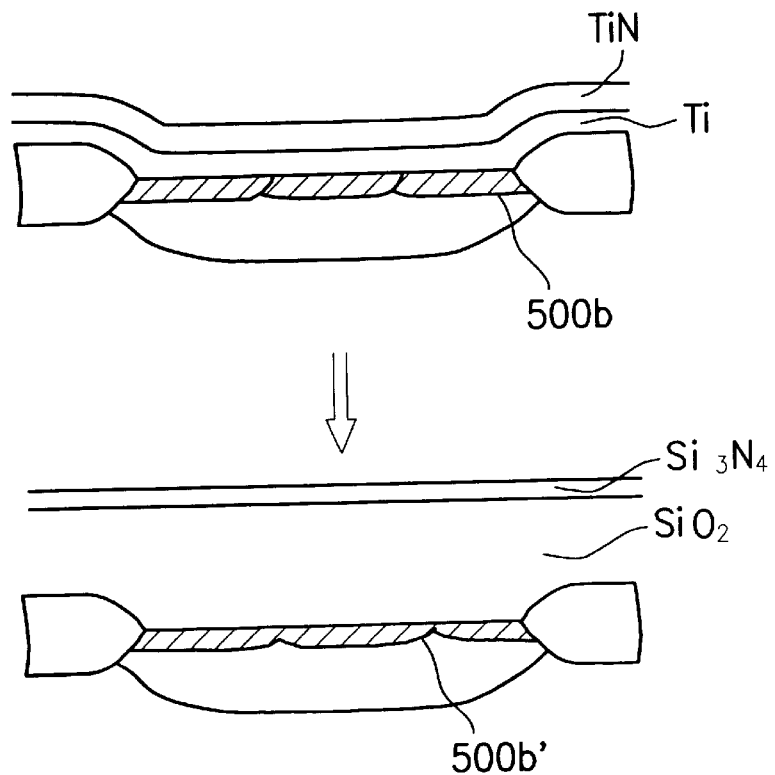
FIG. 5B is a cross-sectional view showing the titanium silicide crystal transformation after subsequent high temperature thermal processing operations for a self-aligned silicide layer formed according to the present invention.

Referring next to FIG. 4C, a titanium layer 460 and a titanium nitride layer 470 are sequentially formed above the silicon substrate 400. The titanium nitride layer acts as a cap layer for increasing the grain size and decreasing the grain boundaries, thus improving the thickness uniformity of the desired metal silicide layer in subsequent high temperature silicon substrate siliciding process. The advantages of using a titanium nitride layer can be better explained with the help of FIGS. 5A and 5B. FIGS. 5A and 5B are cross-sectional views showing the crystal grain transformation in the titanium silicide layer before and after subsequent high temperature processing operations for a conventional process and the process according to this invention respectively. Referring to the upper diagram of FIG. 5A, the grain size in the titanium silicide layer 500a obtained by a conventional self-aligned silicide process is rather small with lots of grain boundaries. Therefore, after subsequent high temperature thermal processing operations, the grains in the titanium silicide layer 500a are not so uniform. This greatly reduces the thickness uniformity of the titanium silicide layer, as shown in the lower diagram of FIG. 5A. On the other hand, referring to the upper diagram of FIG. 5B, the grain size in the titanium silicide layer 500b obtained by a self-aligned silicide process according to this invention is rather large with fewer grain boundaries. Therefore, after subsequent high temperature processing operations, the thickness of the grains in the titanium silicide layer 500b__is more uniform, and this greatly increases the thickness uniformity of the titanium silicide layer as shown in the lower diagram of FIG. 5B. In accordance with the invention, the necessity for having a uniform thickness for the titanium silicide layer is very important. The reason is that if the titanium silicide layer is too thin, then there can be agglomeration into larger lumps, but if the titanium silicide layer is too thick, then junction leakage can be generated. Since both of these conditions can cause damage to the component, the thickness of the titanium silicide layer must be controlled within suitable limits and be as uniform as possible.

Figure 4D:
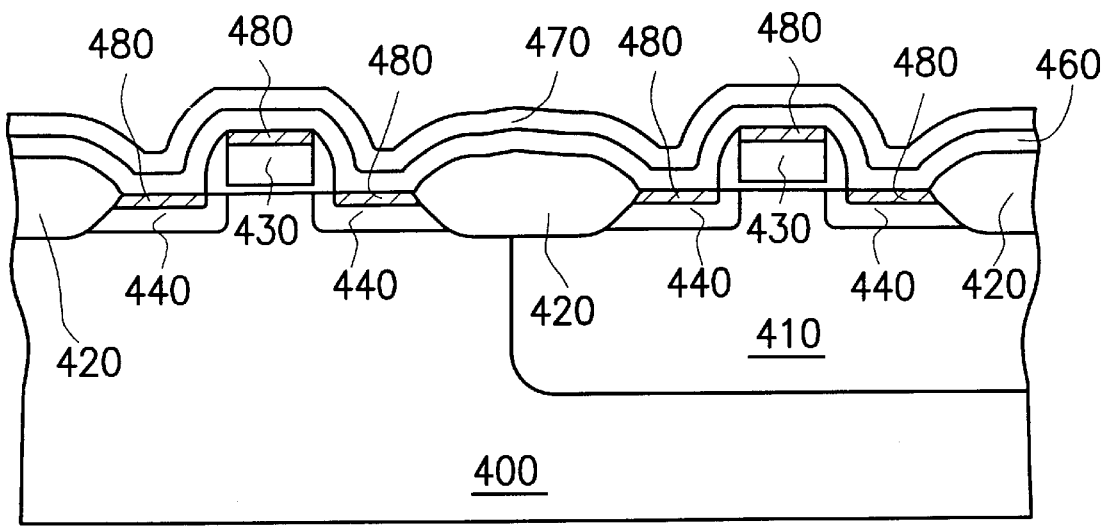

Referring next to FIG. 4D, a two-stage thermal processing operation is performed to silicide the silicon substrate 400 using a high temperature so that a titanium silicide layer 480 is formed by the reaction of silicon or polysilicon layer on the upper surface of the gate terminals 430 and the source/drain terminals 440 with the titanium layers 460. For example, using a rapid thermal processing or a heated oven in an atmosphere of nitrogen, sub-high temperature thermal processing and then a high temperature thermal processing operations are executed in order. The sub-high temperature thermal processing is preferably carried out at 550~700° C. for about 20~60 seconds, and the high temperature thermal processing is preferably carried out at 650~850° C. for about 20~60 seconds.

Figure 4E:
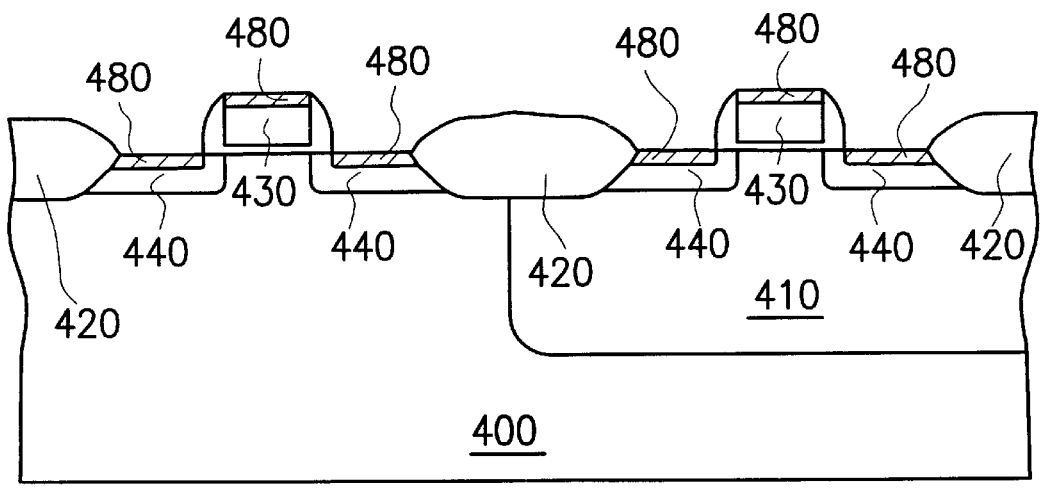

Referring next to FIG. 4E, in the subsequent step the titanium nitride layer 470 and the titanium layer 460 (strictly speaking should be the reacted or residual titanium layer after reaction, and may not necessarily be in the original form of titanium) are removed by a selective etching method. For example, a wet etching method using an RCA-1 prescription of $H_2O:H_2O_2:NH_4OH$ or a SO prescription of $H_2O:H_2O_2:H_2SO_4$ is performed to remove the titanium nitride layer 470 and the titanium layer 460. Finally, a rapid thermal processing can be performed to transform the crystal structure, for example, from a C-49 phase into a C-54 phase, through which the stability of the titanium silicide layer 480 is increased.

From the above description of the preferred embodiment, it is obvious that through the application of the present invention, a desired thickness for the titanium silicide layer can be obtained through suitable control in the amorphous implant operation, and moreover, the silicon nitride cap layer is able to increase the thickness uniformity of the titanium silicide layer formed by the self-aligned silicide process. Furthermore, because of the great intrinsic stability of the titanium silicide layer formed by the present invention, subsequent high temperature thermal processing operations do not adversely effect the titanium silicide layer profile, and hence the yield obtained by the self-aligned silicide process is greatly increased.

It will be apparent to those skilled in the art that various modifications and variations can be made to the structure of the present invention without departing from the scope or spirit of the invention. In view of the foregoing, it is intended that the modifications and variations of this invention be covered provided they fall within the scope of the following claims and their equivalents.

What is claimed is:

1. A process of forming a high temperature stable self-aligned metal suicide layer, comprising the steps of:
    providing a silicon substrate having a gate and source/drain terminals formed thereon;
    implanting ions into the gate and the source/drain terminals;
    sequentially forming a titanium layer and a titanium nitride layer over the silicon substrate;
    performing a two-stage thermal process operation to form a titanium silicide layer from portions of the titanium layer on the gate and the source/drain terminals after the formation of the titanium nitride layer; and
    removing the titanium nitride layer and remaining portions of the titanium layer.

2. A process according to claim 1, wherein the thermal processing operation further includes rapid thermal processing.

3. A process according to claim 1, wherein the implanting step further includes a selective implantation using a mask.

4. A process according to claim 1, wherein the implanting step includes implanting the silicon substrate with arsenic (As) or argon (Ar) or nitrogen ($N^+$) ions having an energy level of between 20~80 KeV and a dosage level of between 5E13~5E14.

5. A process according to claim 1, wherein the thermal processing operation includes sub-high temperature thermal processing and high temperature thermal processing.

6. A process according to claim 5, wherein the sub-high temperature thermal processing includes heating to a temperature of between 550~700 C for about 20~60 seconds.

7. A process according to claim 5, wherein the high temperature thermal processing includes heating to a temperature of between 650~850 C for about 20~60 seconds.

8. A process according to claim 1, wherein the thermal processing operation includes heating in an atmosphere of nitrogen.

9. A process according to claim 1, wherein the removing step includes selective etching the titanium nitride layer and the remaining portions of the titanium layer.

10. A process according to claim 9, wherein the selective etching steps includes a wet etching.

11. A process according to claim 10, wherein the wet etching step includes exposing the titanium nitride layer and the titanium layer to an RCA-1 prescription of $H_2O:H_2O_2:NH_4OH$.

12. A process according to claim 10, wherein the wet etching step includes exposing the titanium nitride layer and the titanium layer to an SO prescription of $H_2O:H_2O_2:H_2SO_4$.

13. A process for forming a high temperature stable self-aligned metal silicide layer, comprising the steps of:
    providing a silicon substrate having an exposed silicon layer and an exposed polysilicon layer thereon;
    performing an amorphous implanting step on the exposed silicon layer and the exposed polysilicon layer;
    forming a titanium layer on the silicon substrate;
    forming a cap layer to cover the titanium layer;
    transforming portions of the titanium nitride layer and portions of the exposed silicon layer and the exposed polysilicon layer by performing a two-stage thermal processing after forming the cap layer;
    removing the cap layer and remaining portions of the titanium layer, and
    performing a rapid thermal process to transform the titanium silicide layer from a C49 phase into a C54 phase.

14. A process according to claim 13, wherein the thermal processing operation further includes rapid thermal processing.

15. A process according to claim 13, wherein the implanting step further includes a selective implantation using a mask.

16. A process according to claim 13, wherein the implanting step includes implanting the silicon substrate with arsenic (As) or argon (Ar) or nitrogen ($N^+$) ions having an energy level of between 20~80 KeV and a dosage level of between 5E13~5E14.

17. A process according to claim 13, wherein the thermal processing operation includes sub-high temperature thermal processing and high temperature thermal processing.

18. A process according to claim 17, wherein the sub-high temperature thermal processing includes heating to a temperature of between 550~700 C for about 20~60 seconds.

19. A process according to claim 17, wherein the high temperature thermal processing includes heating to a temperature of between 650~850 C for about 20~60 seconds.

20. A process according to claim 13, wherein the thermal processing operation includes heating in an atmosphere of nitrogen.

21. A process according to claim 13, wherein the removing step includes selectively etching the cap layer and the remaining portions of the titanium layer.

22. A process according to claim 21, wherein the selective etching steps includes a wet etching.

23. A process according to claim 22, wherein the wet etching step includes exposing the cap layer and the titanium layer to an RCA-1 prescription of $H_2O:H_2O_2:NH_4OH$.

24. A process according to claim 22, wherein the wet etching step includes exposing the cap layer and the titanium layer to an SO prescription of $H_2O:H_2O_2:H_2SO_4$.

* * * * *